(12) United States Patent
Lin et al.

(10) Patent No.: US 11,721,283 B1
(45) Date of Patent: Aug. 8, 2023

(54) DISPLAY PANEL

(71) Applicant: AUO Corporation, Hsinchu (TW)

(72) Inventors: Chun-Yu Lin, Hsinchu (TW); Kun-Cheng Tien, Hsinchu (TW); Jia-Long Wu, Hsinchu (TW); Rong-Fu Lin, Hsinchu (TW); Shu-Hao Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 17/895,073

(22) Filed: Aug. 25, 2022

(30) Foreign Application Priority Data

May 11, 2022 (TW) .................................. 111117634

(51) Int. Cl.
*G09G 3/3233* (2016.01)
(52) U.S. Cl.
CPC ... *G09G 3/3233* (2013.01); *G09G 2300/0426* (2013.01); *G09G 2320/02* (2013.01)

(58) Field of Classification Search
CPC ......... G09G 3/3233; G09G 2300/0426; G09G 2320/02
See application file for complete search history.

(56) References Cited

FOREIGN PATENT DOCUMENTS

| CN | 110767714 | 2/2020 |
|---|---|---|
| CN | 111834429 | 10/2020 |

*Primary Examiner* — Stacy Khoo
(74) *Attorney, Agent, or Firm* — JCIPRNET

(57) ABSTRACT

A display panel includes a plurality of driving electrode regions and a plurality of wiring regions. The plurality of wiring regions are connected between the driving electrode regions. The driving electrode regions are arranged in sequence along an arrangement direction. A $(2n-1)$th wiring region extended from a $(2n-1)$th driving electrode region toward a $(2n)$th driving electrode region has a wiring extending direction forming a positive included angle with the arrangement direction, and a $(2n)$th wiring region extended from the $(2n)$th driving electrode region toward a $(2n+1)$th driving electrode region has a wiring extending direction forming a negative included angle with the arrangement direction, wherein n is a positive integer.

17 Claims, 12 Drawing Sheets

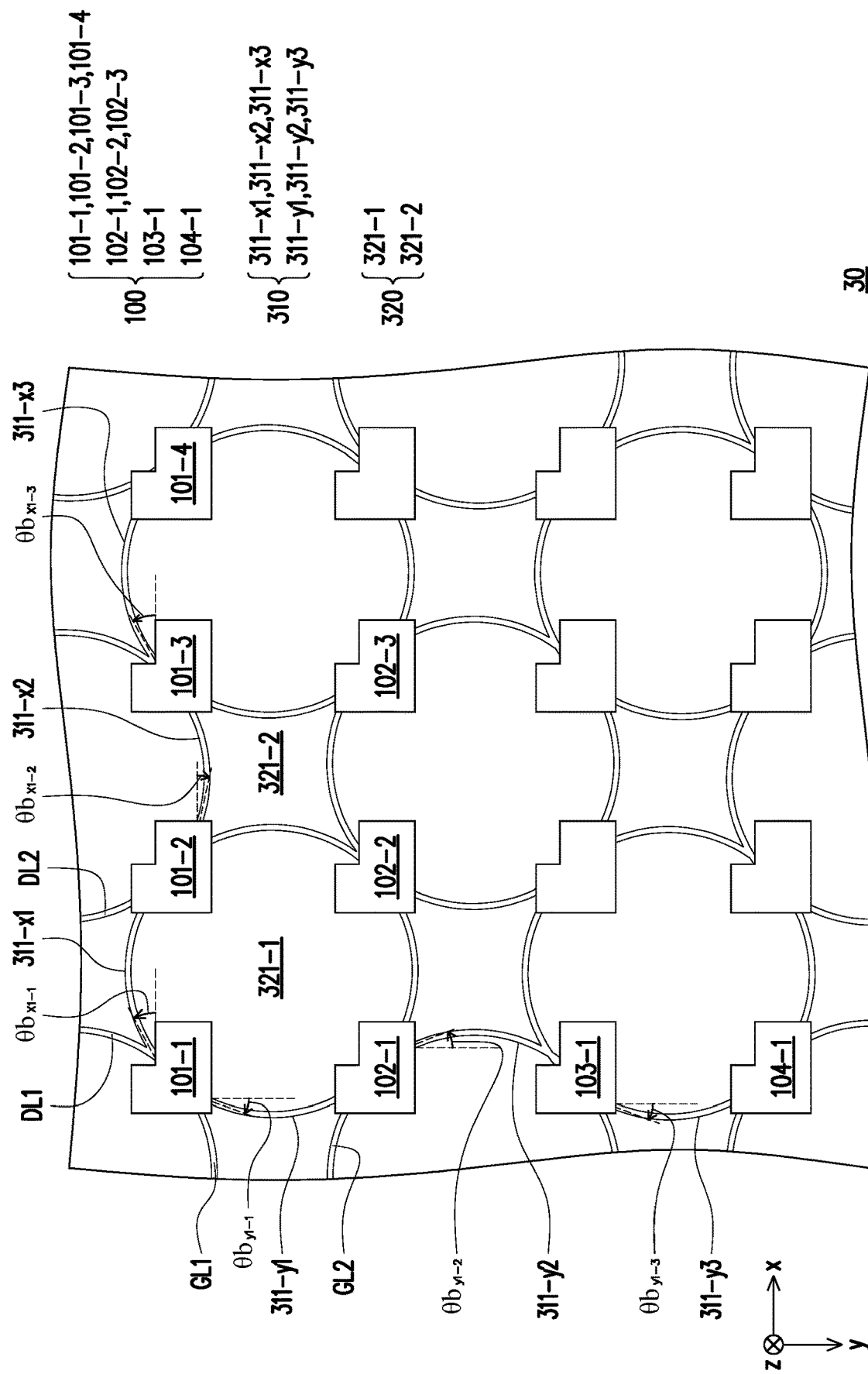

DISPLAY PANEL

CROSS-REFERENCE TO RELATED APPLICATION

This application claims the priority benefit of Taiwan application serial no. 111117634, filed on May 11, 2022. The entirety of the above-mentioned patent application is hereby incorporated by reference herein and made a part of this specification.

BACKGROUND OF THE INVENTION

Field of the Invention

The invention relates to a display device, and more particularly, to a display panel.

Description of Related Art

The transparent display panel is a display panel having a certain degree of transparency. The user may see the image information displayed on the transparent display panel, and may see the background information behind the transparent display panel. Transparent panels are suitable for a variety of scenarios such as vending machines, car windows, and shop windows. The transparent display panel generally adopts liquid-crystal display (LCD), organic light-emitting diode (OLED), or micro light-emitting diode (µLED) techniques.

In order to allow the user to receive the display information and the physical information of the background at the same time, the transparent display panel has an element setting region with low average optical transmission and a transmission region with high average optical transmission. The element setting region may be used for setting the driving electrodes of LCD or self-luminous diodes (for example, OLED or µLED) and related circuit wiring, and the transmission regions allow the user to receive the background behind the transparent display panel. Since the transmission regions are divided into a plurality of small transmission regions by the circuit wiring, this may lead to the generation of diffraction phenomenon and reduce image quality. Therefore, how to reduce the diffraction phenomenon in the transparent display panel and keep the transparency of the transparent display panel to a certain degree has become an urgent issue requiring immediate attention.

SUMMARY OF THE INVENTION

The invention provides a display panel that may improve first-order diffraction and the diffraction of high-frequency terms at the same time, so as to improve the image quality of the display panel.

A display panel of the invention includes a plurality of driving electrode regions and a plurality of wiring regions. The plurality of wiring regions are connected between the driving electrode regions. The driving electrode regions are arranged in sequence along an arrangement direction, a (2n−1)th wiring region extended from a (2n−1)th driving electrode region toward a (2n)th driving electrode region has a wiring extending direction forming a positive included angle with the arrangement direction, and a (2n)th wiring region extended from the (2n)th driving electrode region toward a (2n+1)th driving electrode region has a wiring extending direction forming a negative included angle with the arrangement direction, wherein n is a positive integer.

In an embodiment of the invention, the (2n−1)th wiring region and the (2n)th wiring region are respectively located on two opposite sides of straight connecting lines of the (2n−1)th driving electrode region, the (2n)th driving electrode region, and the (2n+1)th driving electrode region.

In an embodiment of the invention, each of the wiring regions includes a plurality of segments, and two adjacent segments have different extending directions.

In an embodiment of the invention, each of the wiring regions is first extended from one of the driving electrode regions along a first direction and then extended along a second direction toward the next driving electrode region, and the first direction is intersected with the second direction.

In an embodiment of the invention, angles of the positive included angle and the negative included angle are respectively 5 degrees to 44 degrees.

In an embodiment of the invention, the driving electrode regions and the wiring regions have an average optical transmittance of less than 10%.

In an embodiment of the invention, the driving electrode regions and the wiring regions enclose a plurality of transmission regions, and two adjacent transmission regions arranged along the arrangement direction have different geometric shapes.

In an embodiment of the invention, an average optical transmittance of the transmission regions is 10% to 99%.

In an embodiment of the invention, the display panel further includes a plurality of pixel units, and the pixel units are respectively disposed in the driving electrode regions.

In an embodiment of the invention, each of the pixel units includes a plurality of light-emitting units.

In an embodiment of the invention, each of the pixel units includes a pixel circuit element.

In an embodiment of the invention, the display panel further includes a display medium, wherein each of the pixel units further includes a plurality of pixel electrodes, wherein the pixel electrodes are electrically connected to the pixel circuit elements, and the display medium is adapted to be driven by the pixel units.

Based on the above, in the display panel of the invention, the included angles of the wiring extending directions of the wiring regions between adjacent driving electrode regions and the arrangement directions thereof are arranged in a positive and negative alternate configuration in the arrangement directions to effectively reduce the diffraction intensity of first-order diffraction and high-frequency terms, thereby improving the image quality of the display panel.

BRIEF DESCRIPTION OF THE DRAWINGS

FIG. 3 is a schematic top view of a display panel according to an embodiment of the invention.

DESCRIPTION OF THE EMBODIMENTS

Figure 1A:
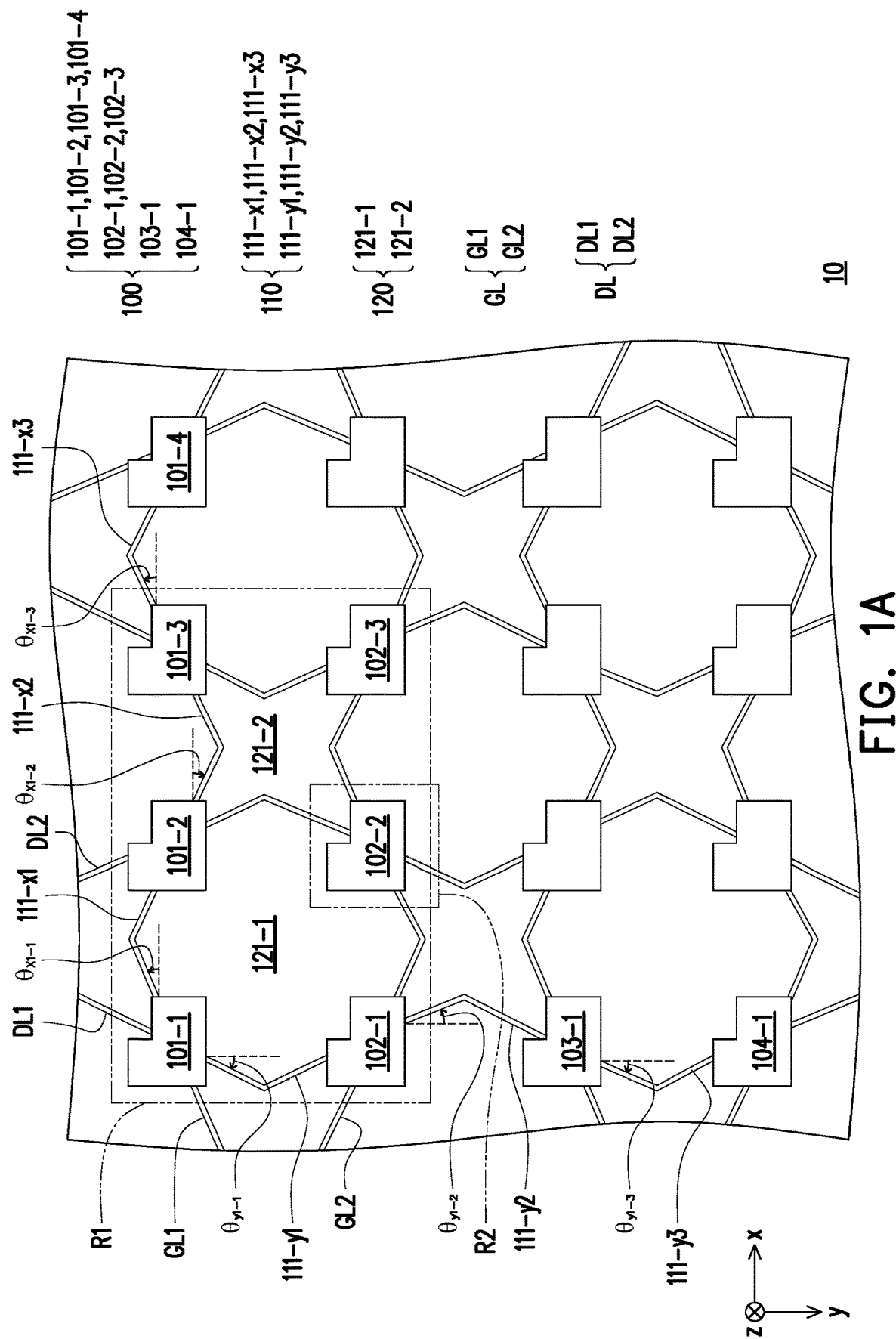
FIG. 1A is a schematic top view of a display panel according to an embodiment of the invention.

The invention is more fully described with reference to the drawings of the present embodiments. However, the invention may also be embodied in various forms and should not be limited to the embodiments described herein. The same or similar reference numerals denote the same or similar elements, and are not repeated in the following paragraphs.

As used herein, "about", "approximately", or "substantially" includes the stated value and the average value within an acceptable deviation of the particular value as determined by one of ordinary skill in the art, taking into account the measurement in question and the specific amount of measurement-related error (i.e., the limitations of the measurement system). For example, "about" may mean within one or a plurality of standard deviations of the stated value, or within ±30%, ±20%, ±10%, ±5%. Furthermore, as used herein, "about", "approximately", or "substantially" may encompass an acceptable range of deviation or standard deviation depending on optical properties, etching properties, or other properties.

Unless otherwise defined, all terms (including technical and scientific terms) used herein have the same meaning as commonly understood by one of ordinary skill in the art to which this invention belongs. Terms such as those defined in commonly used dictionaries should be interpreted as having meanings consistent with their meanings in the context of the related art and the invention, and are not to be interpreted as idealized or overly formal meanings, unless explicitly so defined herein.

Figure 1B:
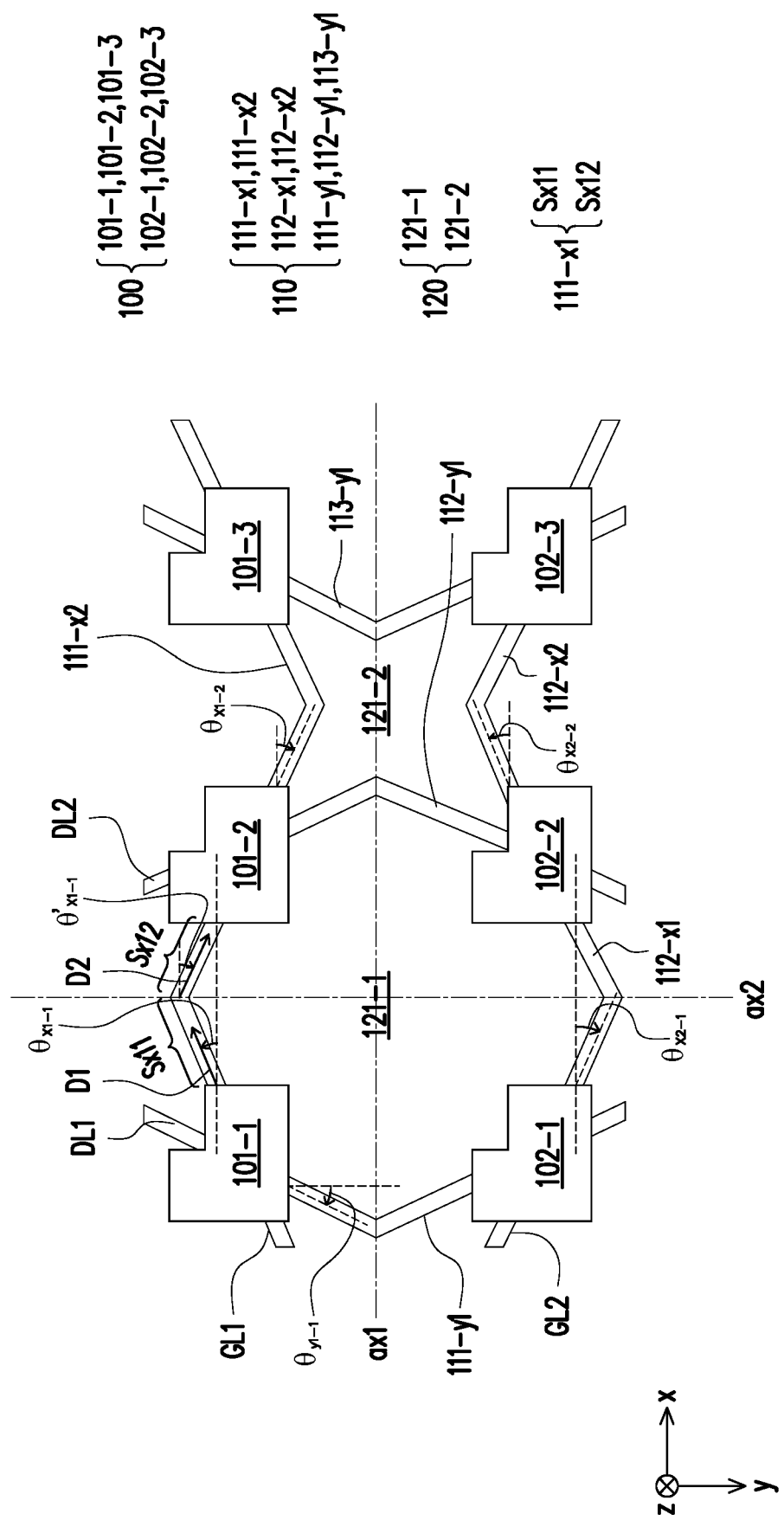
FIG. 1B is a partial enlarged schematic top view of the display panel of FIG. 1A.
Figure 1C:
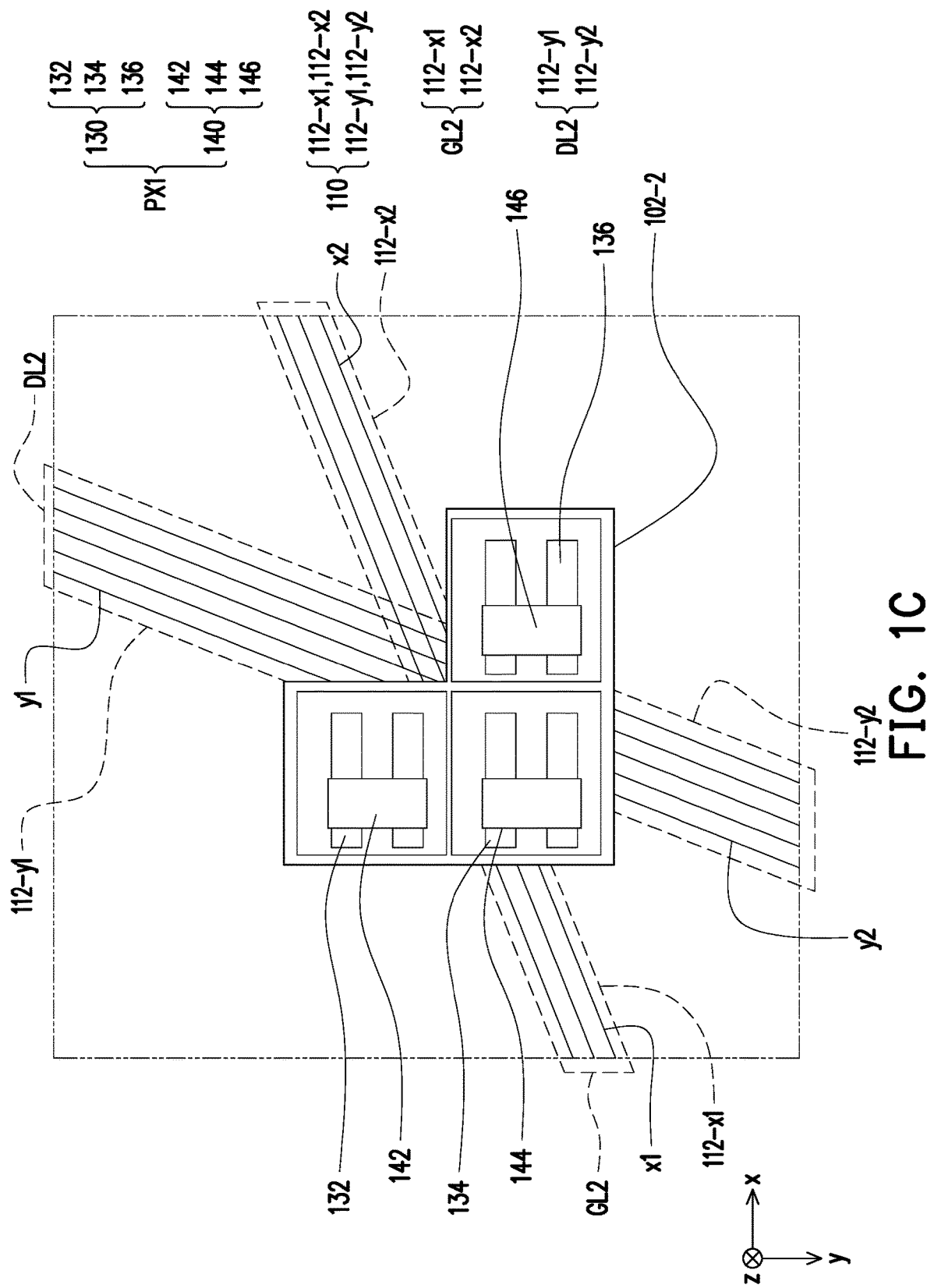
FIG. 1C is a partial enlarged schematic top view of the display panel of FIG. 1A.

FIG. 1A is a schematic top view of a display panel according to an embodiment of the invention. FIG. 1B is a partial enlarged schematic top view of a region R1 of the display panel of FIG. 1A. FIG. 1C is a partial enlarged schematic top view of a region R2 of the display panel of FIG. 1A.

Referring to FIG. 1A to FIG. 1C, a display panel 10 includes a plurality of driving electrode regions 100 and a plurality of wiring regions 110. The plurality of driving electrode regions 100 may be sequentially arranged along the arrangement direction to form a periodic array, and the arrangement direction may be, for example, the x-direction or the y-direction intersecting the x-direction. In some embodiments, the x-direction may be perpendicular to the y-direction, but is not limited thereto. The plurality of wiring regions 110 are connected between the driving electrode regions 100. The plurality of wiring regions 110 may be divided into a plurality of gate line regions GL and a plurality of data line regions DL, wherein the main extending directions of the gate line regions GL and the data line regions DL are different. One or a plurality of wirings may be disposed in each of the plurality of wiring regions 110, and the wiring material is, for example, metal, but the invention is not limited thereto. In other words, the wiring regions 110 may be understood as the regions where the wiring is located, and the distribution of the wiring regions 110 may be determined from the outline of the wiring. The wiring in the wiring regions 110 may be used to transmit signals to the corresponding driving electrode regions 100.

In FIG. 1A, from the perspective of the driving electrode regions 100 arranged along a single arrangement direction (x-direction or y-direction), the (2n−1)th wiring region 110 extended from the (2n−1)th driving electrode region 100 toward the (2n)th driving electrode region 100 has a wiring extending direction forming a positive included angle with the arrangement direction, and the (2n)th wiring region 110 extended from the (2n)th driving electrode region 110 toward the (2n+1)th driving electrode region 100 has a wiring extending direction forming a negative included angle with the arrangement direction, wherein n is a positive integer. The (2n−1)th wiring region 110 and the (2n)th wiring region 110 are respectively located on two opposite sides of the straight connecting lines of the (2n−1)th driving electrode region 100, the (2n)th driving electrode region 100, and the (2n+1)th driving electrode region 100.

For example, the plurality of driving electrode regions 100 include driving electrode regions 101-1, 101-2, 101-3, and 101-4 sequentially arranged in the same column along the x-direction, and the plurality of wiring regions 110 may include wiring regions 111-$x$1, 111-$x$2, and 111-$x$3 alternately arranged with the driving electrode regions 101-1, 101-2, 101-3, and 101-4 along the x-direction. That is to say, the wiring region 111-$x$1 is located between the driving electrode regions 101-1 and 101-2, the wiring region 111-$x$2 is located between the driving electrode regions 101-2 and 101-3, and the wiring region 111-$x$3 is located between the driving electrode regions 101-3 and 101-4. In other words, the wiring region 111-$x$1 and the wiring region 111-$x$2 are located on two opposite sides of the straight connecting lines of the driving electrode regions 101-1, 101-2, and 101-3, respectively, and the wiring region 111-$x$2 and the wiring region 111-$x$3 are located on two opposite sides of the straight connecting lines of the driving electrode regions 101-2, 101-3, and 101-4, respectively. The wirings in the wiring regions 111-$x$1, 111-$x$2, and 111-$x$3 are connected to each other to serve as, for example, gate lines. Therefore, the wiring regions 111-$x$1, 111-$x$2, and 111-$x$3 may be regarded as gate line regions GL1, and related circuit elements such as driving electrodes in the driving electrode regions 101-1, 101-2, 101-3, and 101-4 may be connected to the wiring in the gate line regions GL1 to receive gate signals. In other words, the driving electrode regions 100 arranged in the same column along the x-direction may be connected to the same gate line region GL, and the gate line regions GL may be formed by a plurality of connected wiring regions 110 arranged along the x-direction.

The wiring region 111-$x$1 extended from the driving electrode region 101-1 toward the driving electrode region 101-2 has a wiring extending direction forming a positive included angle $\theta_{x1-1}$ with the x-direction, the wiring region 111-$x$2 extended from the driving electrode region 101-2 toward the driving electrode region 101-3 has a wiring extending direction forming a negative included angle $\theta_{x1-2}$ with the x-direction, and the wiring region 111-$x$3 extended from the driving electrode region 101-3 toward the driving electrode region 101-4 has a wiring extending direction forming a positive included angle $\theta_{x1-3}$ with the x-direction. In the present specification, "wiring extending direction" refers to the wiring region between two driving electrode regions, the wiring extending direction thereof from the initial driving electrode region to the next driving electrode region in the arrangement direction before the first bending. Moreover, in the present specification, the included angle $\theta_x$ of the wiring extending direction and the x-direction is defined as the included angle $\theta_x$ in the counterclockwise direction of the straight connecting lines of adjacent driving electrode regions arranged along the x-direction is a positive included angle, and the included angle $\theta_x$ in the clockwise direction of the straight connecting lines of adjacent driving electrode regions arranged along the x-direction is a negative included angle. In other words, the positive or negative of the included angle $\theta_x$ represents the position thereof relative to the x-direction (straight connecting lines of adjacent driving electrode regions), and the angle of the included angle $\theta_x$ represents the degree of deviation from the x-direction. Therefore, the included angles $\theta_{x1-1}$, $\theta_{x1-2}$, and $\theta_{x1-3}$ of the wiring regions 111-x1, 111-x2, and 111-x3 and the x-direction between the adjacent driving electrode regions 101-1, 101-2, 101-3, and 101-4 are in an alternating positive and negative configuration.

In some embodiments, the angles of the included angles $\theta_{x1-1}$, $\theta_{x1-2}$, and $\theta_{x1-3}$ may respectively be 5 degrees to 44 degrees, so that the size of the light-transmitting opening formed by the wiring regions is variable, without causing a significant increase in the resistance-capacitance load of the wiring regions 110, while still maintaining good electrical performance. In some embodiments, the angles (angle magnitudes) of the included angles $\theta_{x1-1}$, $\theta_{x1-2}$, and $\theta_{x1-3}$ are substantially the same, that is, the wiring extending directions of the adjacent wiring regions 111-x1 and 111-x2 are different, but the wiring region 111-x1 and the wiring region 111-x3 separated by one wiring region have the same trend of wiring extending directions. However, the invention is not limited thereto, and in other embodiments, the angles of the included angles $\theta_{x1-1}$, $\theta_{x1-2}$, and $\theta_{x1-3}$ may be different.

Moreover, the plurality of driving electrode regions 100 include driving electrode regions 101-1, 102-1, 103-1, 104-1 sequentially arranged in the same row along the y-direction, and the plurality of wiring regions 110 include wiring regions 111-y1, 111-y2, and 111-y3 alternately arranged with the driving electrode regions 101-1, 102-1, 103-1, and 104-1 along the y-direction. In other words, the wiring region 111-y1 is located between the driving electrode regions 101-1 and 102-1, the wiring region 111-y2 is located between the driving electrode regions 102-1 and 103-1, and the wiring region 111-y3 is located between the driving electrode regions 103-1 and 104-1. In other words, the wiring region 111-y1 and the wiring region 111-y2 are respectively located on two opposite sides of the straight connecting lines of the driving electrode regions 101-1, 102-1 and 103-1, and the wiring region 111-y2 and the wiring region 111-y3 are respectively located on two opposite sides of the straight connecting lines of the driving electrode regions 102-1, 103-1 and 104-1. The wirings in the wiring regions 111-y1, 111-y2, and 111-y3 are connected to each other to serve as, for example, data lines, and therefore the wiring regions 111-y1, 111-y2, and 111-y3 may be regarded as data line regions DL1, and related circuit elements such as driving electrodes in the driving electrode regions 101-1, 102-1, 103-1, and 104-1 may be connected to the wirings in the data line regions DL1 to receive data signals. In other words, the driving electrode regions 100 arranged in the same row along the y-direction may be connected to the same data line region DL, and the data line regions DL may be formed by the plurality of connected wiring regions 110 arranged along the y-direction.

The wiring region 111-y1 extended from the driving electrode region 101-1 toward the driving electrode region 102-1 has a wiring extending direction forming a negative included angle $\theta_{y1-1}$ with the y-direction, the wiring region 111-y2 extended from the driving electrode region 102-1 toward the driving electrode region 103-1 has a wiring extending direction forming a positive included angle $\theta_{y1-2}$ with the y-direction, and the wiring region 111-y3 extended from the driving electrode region 103-1 toward the driving electrode region 104-1 has a wiring extending direction forming a negative included angle $\theta_{y1-3}$ with the y-direction. In the present specification, the included angle $\theta_y$ between the wiring extending direction and the y-direction is defined as the included angle $\theta_y$ in the counterclockwise direction of the straight connecting lines of adjacent driving electrode regions arranged along the y-direction is a positive included angle, and the included angle $\theta_y$ in the clockwise direction of the straight connecting lines of adjacent driving electrode regions arranged along the y-direction is a negative included angle. That is to say, the positive or negative of the included angle $\theta_y$ represents the position thereof relative to the y-direction (straight connecting lines of adjacent driving electrode regions), and the angle of the included angle $\theta_y$ represents the degree of deviation from the y-direction. Therefore, the included angles $\theta_{y1-1}$, $\theta_{y1-2}$, and $\theta_{y1-3}$ of the wiring regions 111-y1, 111-y2, and 111-y3 and the y-direction between the adjacent driving electrode regions 101-1, 102-1, 103-1, and 104-1 are in an alternating positive and negative configuration.

In some embodiments, the angles of the included angles $\theta_{y1-1}$, $\theta_{y1-2}$, and $\theta_{y1-3}$ may respectively be 5 degrees to 44 degrees, so that the size of the light-transmitting opening formed by the wiring regions is variable without causing a significant increase in the resistance-capacitance load of the wiring regions 110, while still maintaining good electrical performance. In some embodiments, the angles (angle sizes) of the included angles $\theta_{y1-1}$, $\theta_{y1-2}$, and $\theta_{y1-3}$ are substantially the same, that is to say, the wiring extending directions of adjacent wiring regions 111-y1 and 111-y2 are different, but the wiring region 111-y1 and the wiring region 111-y3 separated by one wiring region have the same trend of wiring extending directions. However, the invention is not limited thereto, and in other embodiments, the angles of the included angles $\theta_{y1-1}$, $\theta_{y1-2}$, and $\theta_{y1-3}$ may be different.

In an embodiment, the angle of the included angle $\theta_x$ of the wiring extending direction of the wiring regions 110 arranged along the x-direction and the x-direction may be the same as the angle of the included angle $\theta_y$ of the wiring extending direction of the wiring regions 110 arranged along the y-direction and the y-direction. For example, the angle of the included angle $\theta_{x1-1}$ between the wiring extending direction of the wiring region 111-x1 extended from the driving electrode region 101-1 toward the driving electrode region 101-2 and the x-direction and the angle of the included angle $\theta_{y1-1}$ between the wiring region 111-y1 extended from the driving electrode region 101-1 toward the driving electrode region 102-1 and the y-direction are substantially the same.

In an embodiment, two adjacent gate line regions GL are symmetrical about each other, and two adjacent data line regions DL are symmetrical about each other. For example, as shown in FIG. 1B, the gate line region GL1 and the gate line region GL2 are symmetrical about an axis ax1, wherein the gate line region GL1 includes the wiring region 111-x1 and the wiring region 111-x2, and the gate line region GL2 includes a wiring region 112-x1 and a wiring region 112-x2. That is to say, the wiring region 111-x1 and the wiring region 112-x1 are symmetrical about the axis ax1, and the wiring region 111-x2 and the wiring region 112-x2 are symmetrical about the axis ax1. Similarly, the data line region DL1 and a data line region DL2 are symmetrical about an axis ax2, wherein the data line region DL1 includes the line region 111-y1, and the data line region DL2 includes a wiring region 112-$y$1. That is to say, the wiring region 111-$y$1 and the wiring region 112-$y$1 are symmetrical about the axis ax2.

In some embodiments, each of the wiring regions 110 may include a plurality of segments, and two adjacent segments have different extending directions. For example, as shown in FIG. 1B, the wiring region 111-$x$1 includes a first segment Sx11 and a second segment Sx12 arranged in sequence in the x-direction, and the first segment Sx11 and the second segment Sx12 are symmetrical about each other, for example, symmetrical about the axis ax2, but not limited thereto. The first segment Sx11 is extended from the driving electrode region 101-1 along a first direction D1, the second segment Sx12 is extended from the end of the first segment Sx11 toward the driving electrode region 101-2 along a second direction D2, the first direction D1 and the second direction D2 are intersected with each other, and the second direction D2 is a direction more toward the driving electrode region 101-2 than the first direction D1. The first direction D1 is, for example, a direction forming the positive included angle $\theta_{x1-1}$ with the x-direction, the second direction D2 is, for example, a direction forming a negative included angle $\theta'_{x1-1}$ with the x-direction, and the angle of the included angle $\theta_{x1-1}$ and the angle of the included angle $\theta'_{x1-1}$ may be the same. In other words, the wiring region 111-$x$1 is connected from the driving electrode region 101-1 to the driving electrode region 101-2 after being bent once. Since the wiring regions 110 of two adjacent driving electrode regions 100 do not directly connect the adjacent driving electrode regions 100 in a straight line, the size of the light-transmitting openings formed by the wiring regions may be varied, thus facilitating to disperse the diffraction of high-frequency terms, thereby effectively reducing the diffraction intensity of high-frequency terms, and thereby improving the image quality of the display panel 10.

In some embodiments, the driving electrode regions 100 and the wiring regions 110 may enclose a plurality of transmission regions 120. The average optical transmittance of the transmission regions 120 is 10% to 99%, and the driving electrode regions 100 and the wiring regions 110 have an average optical transmittance of less than 10%. That is to say, the driving electrode regions 100 and the wiring regions 110 are non-transmission regions compared to the transmission regions 120. In some embodiments, a light-shielding layer (not shown) may be used to cover the edge of the wiring regions 110 and/or the driving electrode regions 100, so that the average optical transmittance of the driving electrode regions 100 and the wiring regions 110 is less than 10%. In some embodiments, the light-shielding layer may be made of a light-shielding material such as light-shielding resin and metal.

In some embodiments, two adjacent transmission regions 120 arranged along the arrangement direction have different geometric shapes. For example, as shown in FIG. 1A and FIG. 1B, a transmission region 121-1 enclosed by the driving electrode regions 101-1, 101-2, 102-1, and 102-2 and the wiring regions 111-$x$1, 112-$x$1, 111-$y$1, and 112-$y$1 has a shape similar to a convex octagon, and a transmission region 121-2 enclosed by the driving electrode regions 101-2, 101-3, 102-2, and 102-3 and the wiring regions 111-$x$2, 112-$x$2, 112-$y$1, and 113-$y$1 has a shape similar to a star. In FIG. 1A, the transmission regions 120 having a shape similar to a convex octagon and the transmission regions 120 having a shape similar to a star are staggered in the arrangement direction. In other words, two adjacent transmission regions 120 arranged along the arrangement direction have different geometric shapes, and every other transmission region 120 in the arrangement direction may have the same geometric shape. In some embodiments, two adjacent transmission regions 120 arranged along the arrangement direction have different areas. For example, the area of the transmission region 121-1 is greater than the area of the transmission region 121-2.

For convenience of illustration, only the layout of each of the wiring regions is shown schematically in FIG. 1A and FIG. 1B. However, it should be understood that a plurality of wirings may be disposed in each of the wiring regions 110, as shown in FIG. 1C. In addition, a plurality of wirings in each of the wiring regions may be arranged side by side on the same film layer or located on different film layers and possibly overlapped with each other. Each of the wiring regions 110 may be centrally arranged with a plurality of wirings to help reduce the intensity of the first-order diffraction caused by the wiring layout and improve the average optical transmittance of the transmission regions 120.

In some embodiments, a plurality of wirings may be disposed in the same gate line region GL and extended across the driving electrode region 100 corresponding to the same gate line region GL to be overlapped with the driving electrode region 100. In addition, the wirings in the corresponding segments of two wiring regions 110 adjacent to two sides of the same driving electrode region 100 may have the same extending direction and be on the same line. For example, as shown in FIG. 1C, in the gate line region GL2, the second segment located in the wiring region 112-$x$1 and the first segment located in the wiring region 112-$x$2 are two segments adjacent to the driving electrode region 102-2. The extending direction of a wiring x1 located in the second segment of the wiring region 112-$x$1 is the same as and on the same line as the extending direction of a wiring x2 located in the first segment of the wiring region 112-$x$2. In some embodiments, the wirings x1 and x2 may be extended toward the corresponding driving electrode region 102-2 and connected to each other to form a continuous signal line (e.g., a gate line). The elements and signal lines in the driving electrode region 102-2 may be located in different layers according to circuit connection requirements, so as to avoid unnecessary short circuits.

Similarly, a plurality of wirings may be disposed in the same data line region DL and extended across the driving electrode region 100 corresponding to the same data line region DL and overlapped with the driving electrode region 100. In addition, the corresponding segments of two wiring regions 110 adjacent to two sides of the same data line region DL have the same extending direction and are on the same line. For example, as shown in FIG. 1C, in the data line region DL2, the second segment located in the wiring region 112-$y$1 and the first segment located in a wiring region 112-$y$2 are two segments adjacent to the driving electrode region 102-2. The extending direction of a wiring y1 located in the second segment of the wiring region 112-$y$1 is the same as and on the same line as the extending direction of a wiring y2 located in the first segment of the wiring region 112-$y$2. In some embodiments, the wiring y1 and the wiring y2 may be extended toward the corresponding driving electrode region 102-2 and be connected to each other to form a continuous signal line (e.g., a data line). The elements and data lines in the driving electrode region 102-2 may be located in different layers according to circuit connection requirements, so as to avoid unnecessary short circuits.

In some embodiments, as shown in FIG. 1C, the projection of the driving electrode regions 100 in the z-direction is partially overlapped with the projection of the wiring in the wiring regions 110 in the z-direction, so as to expand the range of the transmission regions 120, but the invention is not limited thereto. In other embodiments, the projection of the driving electrode regions 100 in the z-direction and the projection of the wiring in the wiring regions 110 in the z-direction may be not overlapped.

In FIG. 1C, the shape of the driving electrode regions 100 is approximately the shape of L. It should be understood that the shape of the driving electrode regions 100 is not limited thereto. Other geometric shapes of the driving electrode regions 100 may be used according to different display panels, such as rectangles, circles, trapezoids, or other arbitrary geometric shapes.

Referring to FIG. 1C, the display panel 10 may be a micro-LED display panel further including a plurality of pixel units PX1. The pixel units PX1 are respectively disposed in the driving electrode regions 100, and each of the pixel units PX1 may include a pixel circuit element 130 and a plurality of light-emitting units 140. For example, the pixel circuit element 130 includes, for example, a thin-film transistor (TFT) adapted to drive the plurality of light-emitting units 140. The plurality of light-emitting units 140 may include three micro-LEDs 142, 144, and 146 to emit light of different colors. For example, the micro-LEDs 142, 144, and 146 may emit blue, green, and red light, respectively, but the invention is not limited thereto. In some embodiments, the pixel circuit element 130 may include three pixel circuit units 132, 134, and 136 to drive the micro-LEDs 142, 144, and 146 respectively, but the invention is not limited thereto. The micro-LED 142 and the micro-LED 144 may be arranged along the y-direction, the micro-LED 146 is located on one side of the micro-LED 144 and arranged along the x-direction with the micro-LED 144, but may also be arranged in different ways depending on different designs. In other embodiments, the micro-LEDs 142, 144, and 146 may all be arranged along the x-direction or the y-direction, so that the shape of the driving electrode regions 100 is rectangular. The micro-LEDs 142, 144, and 146 have self-luminous properties and do not need an additional light source, and may receive electrical signals and power needed for luminescence via the corresponding wiring in the data line region DL2.

Figure 2A:
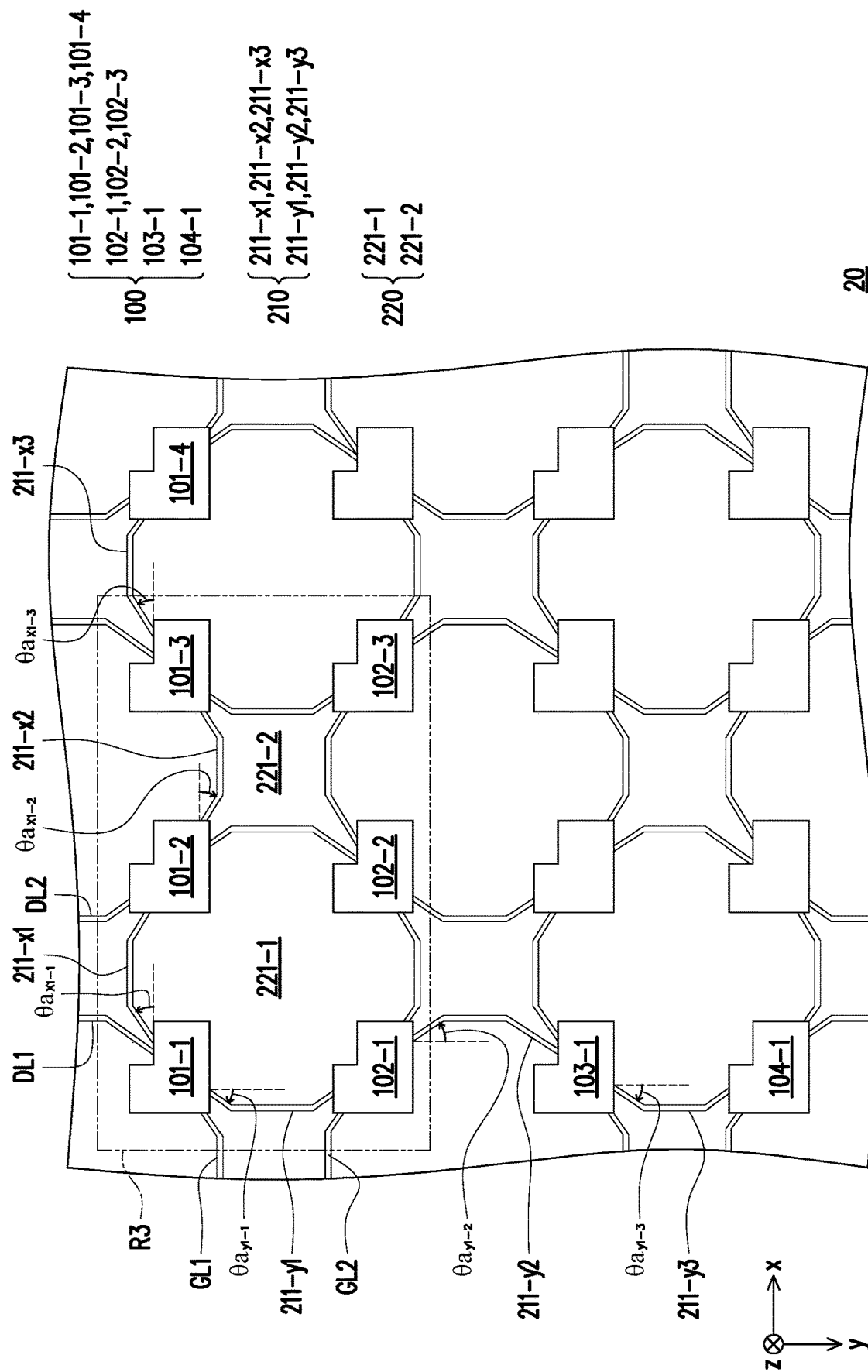
FIG. 2A is a schematic top view of a display panel according to an embodiment of the invention.
Figure 2B:
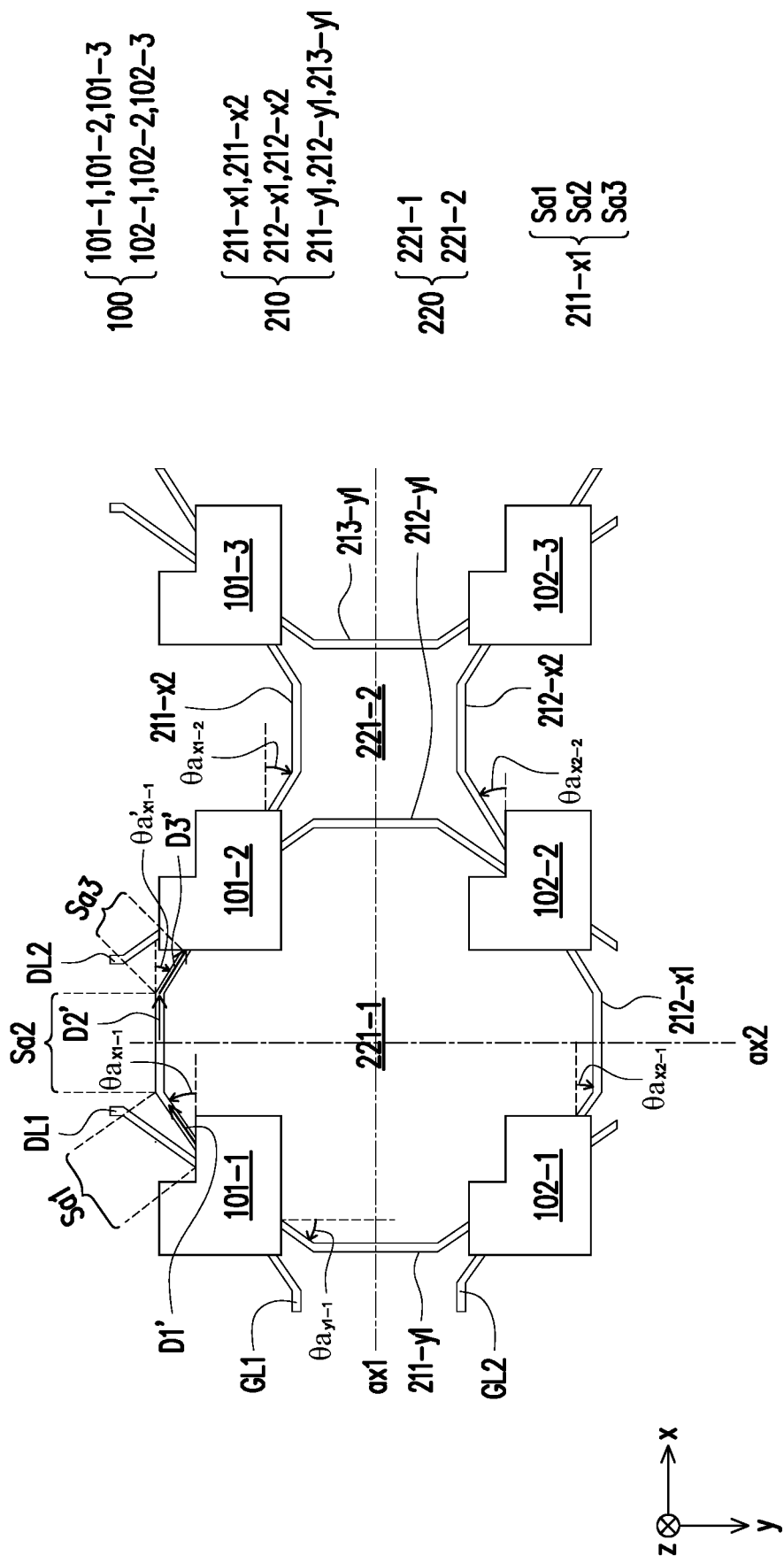
FIG. 2B is a partial enlarged schematic top view of the display panel of FIG. 2A.

FIG. 2A is a schematic top view of a display panel according to an embodiment of the invention. FIG. 2B is a partially enlarged top plan view of a region R3 of the display panel of FIG. 2A. It should be mentioned here that the embodiment of FIG. 2A and FIG. 2B adopts the reference numerals and a portion of the content of the embodiment of FIG. 1A and FIG. 1B, wherein the same or similar reference numerals are used to represent the same or similar elements, and the description of the same technical content is omitted. For the description of the omitted portion, reference may be made to the above embodiment, which is not repeated herein.

Referring to FIG. 2A and FIG. 2B, a display panel 20 includes the plurality of driving electrode regions 100 and a plurality of wiring regions 210, and the plurality of wiring regions 210 are connected between the driving electrode regions 100. The driving electrode regions 100 may be sequentially arranged along the arrangement direction to form a periodic array, and the arrangement direction may be, for example, the x-direction or the y-direction perpendicular to the x-direction. The (2n−1)th wiring region 210 extended from the (2n−1)th driving electrode region 100 toward the (2n)th driving electrode region 100 has a wiring extending direction forming a positive included angle with the arrangement direction, and the (2n)th wiring region 210 extended from the (2n)th driving electrode region 100 toward the (2n+1)th driving electrode region 100 has a wiring extending direction forming a negative included angle with the arrangement direction, wherein n is a positive integer. For example, included angles $\theta a_{x1\text{-}1}$, $\theta a_{x1\text{-}2}$, and $\theta a_{x1\text{-}3}$ of wiring regions 211-$x$1, 211-$x$2, and 211-$x$3 and the x-direction between the adjacent driving electrode regions 101-1, 101-2, 101-3, and 101-4 are in an alternating positive and negative configuration. Included angles $\theta a_{y1\text{-}1}$, $\theta a_{y1\text{-}2}$, and $\theta_{ay1\text{-}3}$ of wiring regions 211-$y$1, 211-$y$2, and 211-$y$3 and the y-direction between the adjacent driving electrode regions 101-1, 102-1, 103-1, and 104-1 are in an alternating positive and negative configuration.

Different from the display panel 10, in the present embodiment, as shown in FIG. 2B, each of the wiring regions 210 includes three segments with different extending directions. For example, the wiring region 211-$x$1 includes a first segment Sa1, a second segment Sa2, and a third segment Sa3 arranged in sequence in the x-direction. The first segment Sa1 is extended from the driving electrode region 101-1 along a first direction D1', the second segment Sa2 is extended from the end of the first segment Sa1 along a second direction D2', and the third segment Sa3 is extended from the end of the second segment Sa2 along a third direction D3' toward the driving electrode region 101-2. The first direction D1', the second direction D2', and the third direction D3' are different directions and intersected with each other. Compared with the first direction D1', the second direction D2' is a direction more toward the driving electrode region 101-2, and the third direction D3' is a direction more toward the driving electrode region 101-2 compared with the second direction D2'. For example, the first direction D1' is a direction forming the positive included angle $\theta a_{x1\text{-}1}$ with the x-direction, the second direction D2' is a direction parallel to the x-direction, and the third direction D3' is a direction forming a negative included angle $\theta a'_{x1\text{-}1}$ with the x-direction, wherein the angle of the included angle $\theta a_{x1\text{-}1}$ and the angle of the included angle $\theta a'_{x1\text{-}1}$ may be the same. In other words, the wiring region 211-$x$1 is connected from the driving electrode region 101-1 to the driving electrode region 101-2 after being bent twice. Since the wiring regions 210 of the adjacent driving electrode regions 100 do not directly connect the adjacent driving electrode regions 100 in a straight line manner, the size of the light-transmitting opening formed in the wiring regions may be varied, thus helping to disperse the diffraction of high-frequency terms. Thus, the diffraction intensity of high-frequency terms is effectively reduced, and the image quality of the display panel 20 is improved.

In the present embodiment, the driving electrode regions 100 and the wiring regions 210 may enclose a plurality of transmission regions 220, and two adjacent transmission regions 220 arranged along the arrangement direction have different geometric shapes, and the areas of two adjacent transmission regions 220 arranged along the arrangement direction are different. For example, as shown in FIG. 2A and FIG. 2B, a transmission region 221-1 enclosed by the driving electrode regions 101-1, 101-2, 102-1, and 102-2 and the wiring regions 211-$x$1, 212-$x$1, 211-$y$1, and 212-$y$1 has a convex polygon shape, and a transmission region 221-2 enclosed by the driving electrode regions 101-2, 101-3, 102-2, and 102-3 and the wiring regions 211-$x$2, 212-$x$2, 212-$y$1, and 213-$y$1 has a concave polygon shape. The transmission regions 220 having the same shape as the transmission region 221-1 and the transmission regions 220 having the same shape as the transmission region 221-2 are staggered in the arrangement direction, and the area of the transmission region 221-1 is greater than the area of the transmission region 221-2.

FIG. 3 is a schematic top view of a display panel according to an embodiment of the invention. It should be mentioned here that the embodiment of FIG. 3 adopts the reference numerals and a portion of the content of the embodiment of FIG. 1A, wherein the same or similar elements are denoted by the same or similar reference numerals, and the description of the same technical content is omitted. For the description of the omitted portion, reference may be made to the above embodiments, which is not repeated herein.

Referring to FIG. 3, a display panel 30 includes the plurality of driving electrode regions 100 and a plurality of wiring regions 310, and the plurality of wiring regions 310 are connected between the driving electrode regions 100. The driving electrode regions 100 may be sequentially arranged along the arrangement direction to form a periodic array, and the arrangement direction may be, for example, the x-direction or the y-direction perpendicular to the x-direction. The (2n−1)th wiring region 310 extended from the (2n−1)th driving electrode region 100 toward the (2n)th driving electrode region 100 has a wiring extending direction forming a positive included angle with the arrangement direction, and the (2n)th wiring region 310 extended from the (2n)th driving electrode region 100 toward the (2n+1)th driving electrode region 100 has a wiring extending direction forming a negative included angle with the arrangement direction, wherein n is a positive integer. For example, included angles $\theta b_{x1-1}$, $\theta b_{x1-2}$, and $\theta b_{x1-3}$ of wiring regions 311-x1, 311-x2, and 311-x3 and the x-direction between the adjacent driving electrode regions 101-1, 101-2, 101-3, and 101-4 are in an alternating positive and negative configuration. Included angles $\theta b_{y1-1}$, $\theta b_{y1-2}$, and $\theta b_{y1-3}$ of wiring regions 311-y1, 311-y2, and 311-y3 and the y-direction between the adjacent driving electrode regions 101-1, 102-1, 103-1, and 104-1 are in an alternating positive and negative configuration.

Different from the display panel 10, in the present embodiment, each of the wiring regions 310 includes segments (not marked) with an infinite number of different extending directions, that is, the wiring regions 310 are connected from the driving electrode region 101-1 to the driving electrode region 101-2 after being bent an infinite number of times. Since each of the wiring regions 310 includes segments with an infinite number of different extending directions, each of the wiring regions 310 has an arc shape. In some embodiments, the wiring regions 310 between the driving electrode regions 101-1, 102-1, 101-2, and 102-2 may be extended along a circular track. However, in some embodiments, the wirings regions 310 may have different centers of curvature. Since the wiring regions 310 of two adjacent driving electrode regions 100 do not directly connect the adjacent driving electrode regions 100 in a straight line manner, the size of the light-transmitting opening formed in the wiring regions may be varied, thus helping to disperse the diffraction of high-frequency terms. Thus, the diffraction intensity of high-frequency terms is effectively reduced, and the image quality of the display panel 30 is improved.

In the present embodiment, the driving electrode regions 100 and the wiring regions 310 may enclose a plurality of transmission regions 320, and two adjacent transmission regions 320 arranged along the arrangement direction of the driving electrode regions 100 have different geometric shapes and different areas. For example, as shown in FIG. 3, the transmission regions 320 having the same shape as a transmission region 321-1 and the transmission regions 320 having the same shape as a transmission region 321-2 are staggered in the arrangement direction, and the area of the transmission region 321-1 is greater than the area of the transmission region 321-2.

Figure 4A:
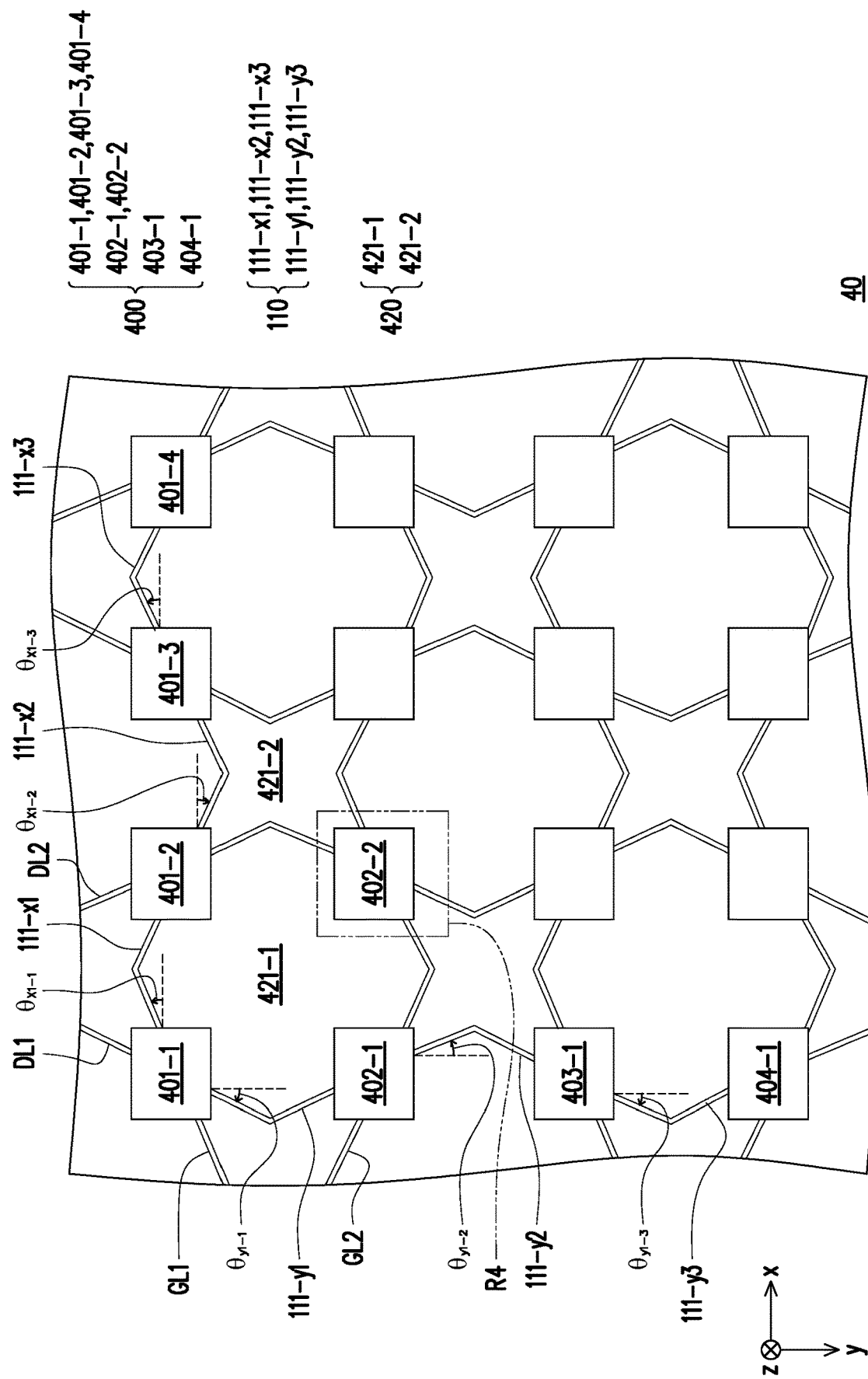
FIG. 4A is a schematic top view of a display panel according to an embodiment of the invention.
Figure 4B:
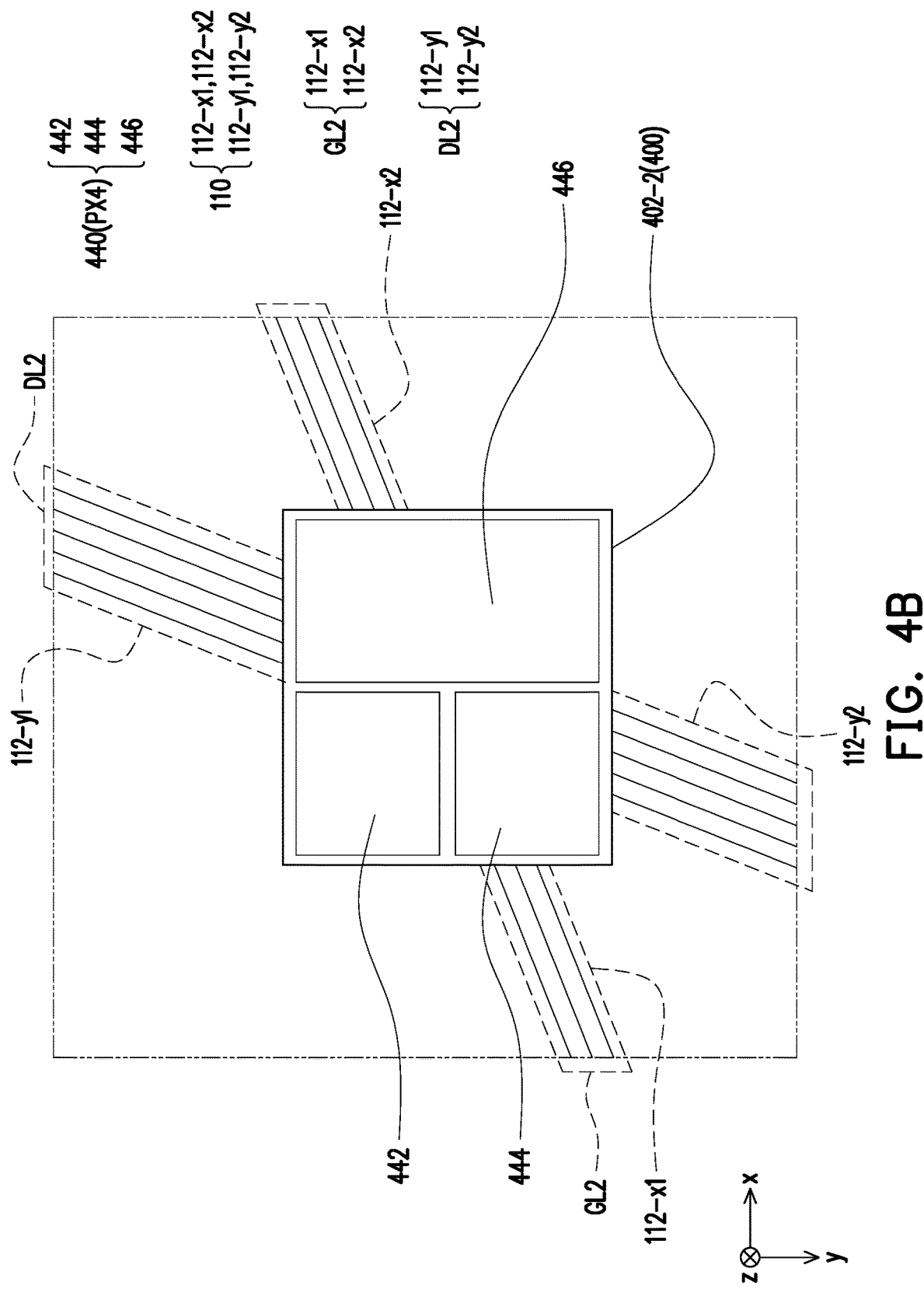
FIG. 4B is a partial enlarged schematic top view of the display panel of FIG. 4A.

FIG. 4A is a schematic top view of a display panel according to an embodiment of the invention. FIG. 4B is a partially enlarged top plan view of a region R4 of the display panel of FIG. 4A. It should be mentioned here that, the embodiment of FIG. 4A and FIG. 4B adopts the reference numerals and a portion of the content of the embodiment of FIG. 1A and FIG. 1C, wherein the same or similar elements are denoted by the same or similar reference numerals, and the description of the same technical content is omitted. For the description of the omitted portion, reference may be made to the above embodiments, which is not repeated herein.

Referring to FIG. 4A and FIG. 4B, a display panel 40 includes a plurality of driving electrode regions 400 and the plurality of wiring regions 110, and the plurality of wiring regions 110 are connected between the driving electrode regions 400. The driving electrode regions 400 may be sequentially arranged along the arrangement direction to form a periodic array, and the arrangement direction may be, for example, the x-direction or the y-direction perpendicular to the x-direction. The (2n−1)th wiring region 110 extended from the (2n−1)th driving electrode region 400 toward the (2n)th driving electrode region 400 has a wiring extending direction forming a positive included angle with the arrangement direction, and the (2n)th wiring region 110 extended from the (2n)th driving electrode region 400 toward the (2n+1)th driving electrode region 400 has a wiring extending direction forming a negative included angle with the arrangement direction, wherein n is a positive integer. For example, the included angles $\theta_{x1-1}$, $\theta_{x1-2}$, and $\theta_{x1-3}$ of the wiring regions 111-x1, 111-x2, and 111-x3 and the x-direction between adjacent driving electrode regions 401-1, 401-2, 401-3, and 401-4 are in an alternating positive and negative configuration. The included angles $\theta_{y1-1}$, $\theta_{y1-2}$, and $\theta_{y1-3}$ of the wiring regions 111-y1, 111-y2, and 111-y3 and the y-direction between adjacent driving electrode regions 401-1, 402-1, 403-1, and 404-1 are in an alternating positive and negative configuration.

Different from the display panel 10, in the present embodiment, the display panel 40 may be an OLED display panel, and the shape of the driving electrode regions 400 is a rectangle. The display panel 40 includes a plurality of pixel units PX4. The pixel units PX4 are respectively disposed in the driving electrode regions 400, and each of the pixel units PX4 may include a pixel circuit element (not shown) and a plurality of light-emitting units 440. For example, the pixel circuit elements include, for example, TFTs adapted to drive the plurality of light-emitting units 440. The plurality of light-emitting units 440 may include three OLEDs 442, 444, and 446 to emit light of different colors. For example, the OLEDs 442, 444, and 446 may emit red, green, and blue light, respectively, but the invention is not limited thereto. The light-emitting areas of the OLEDs 442, 444, and 446 may be adjusted according to the desired light-emitting effect. For example, the OLED 446 may have a greater light-emitting area than the OLED 442 and the OLED 444, but is not limited thereto. In the present embodiment, the OLEs 442 and the OLED 444 are arranged along the y-direction and located on the same side of the OLED 446. However, the arrangement and quantity of the OLEDs 442, 444, and 446 are not limited to the present embodiment. The OLEDs 442, 444, and 446 have self-luminous properties and do not need an additional light source, and may receive electrical signals and power needed for light emission via the corresponding wiring in the data line region DL2.

In the present embodiment, the driving electrode regions 400 and the wiring regions 410 may enclose a plurality of transmission regions 420, and two adjacent transmission regions 420 arranged along the arrangement direction of the driving electrode regions 400 have different geometric shapes and different areas. For example, as shown in FIG. 4A, the transmission regions 420 having the same shape as a transmission region 421-1 and the transmission regions 420 having the same shape as a transmission region 421-2 are staggered in the arrangement direction, and the area of the transmission region 421-1 is greater than the area of the transmission region 421-2.

Figure 5A:
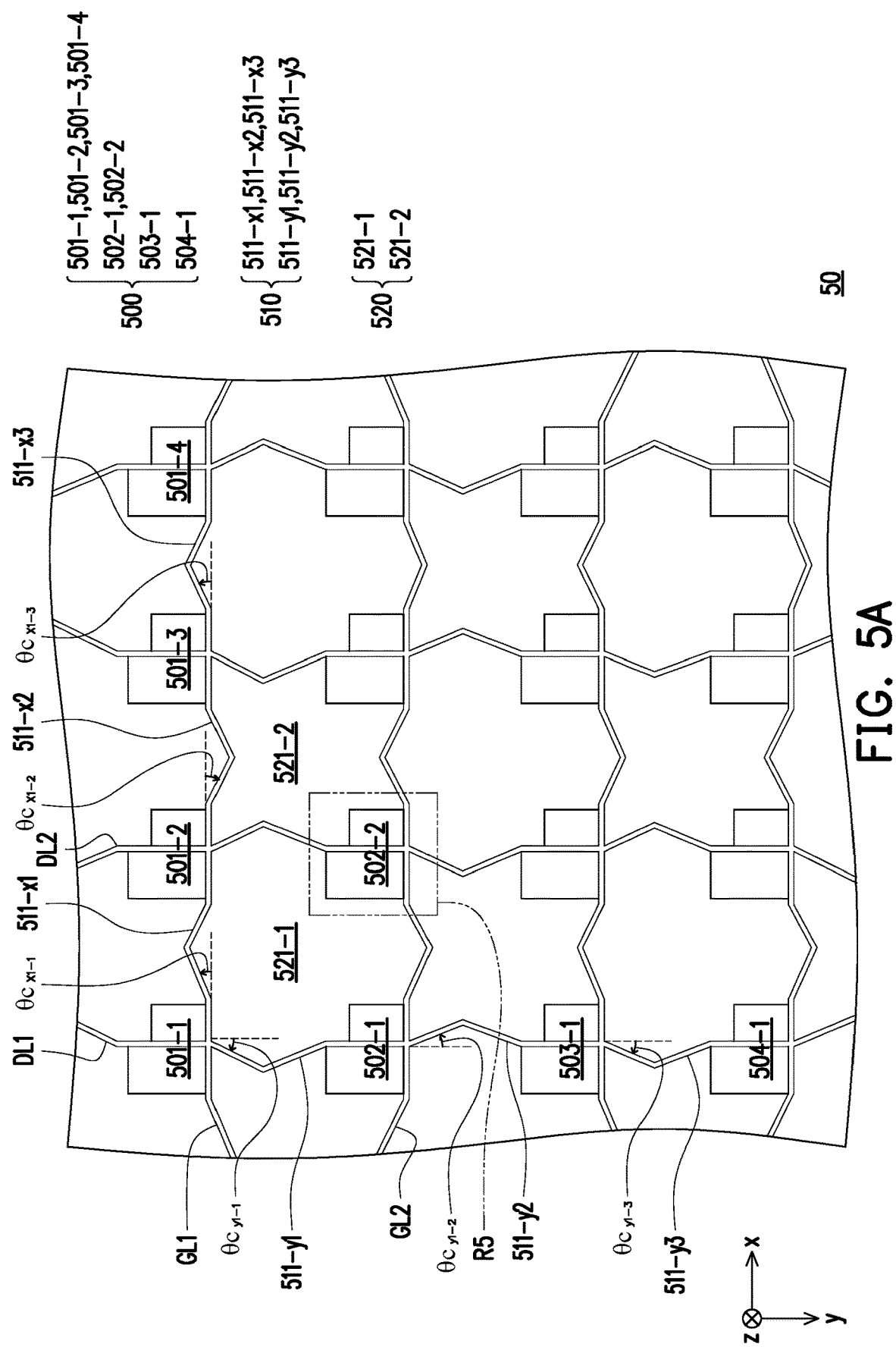
FIG. 5A is a schematic top view of a display panel according to an embodiment of the invention.
Figure 5B:
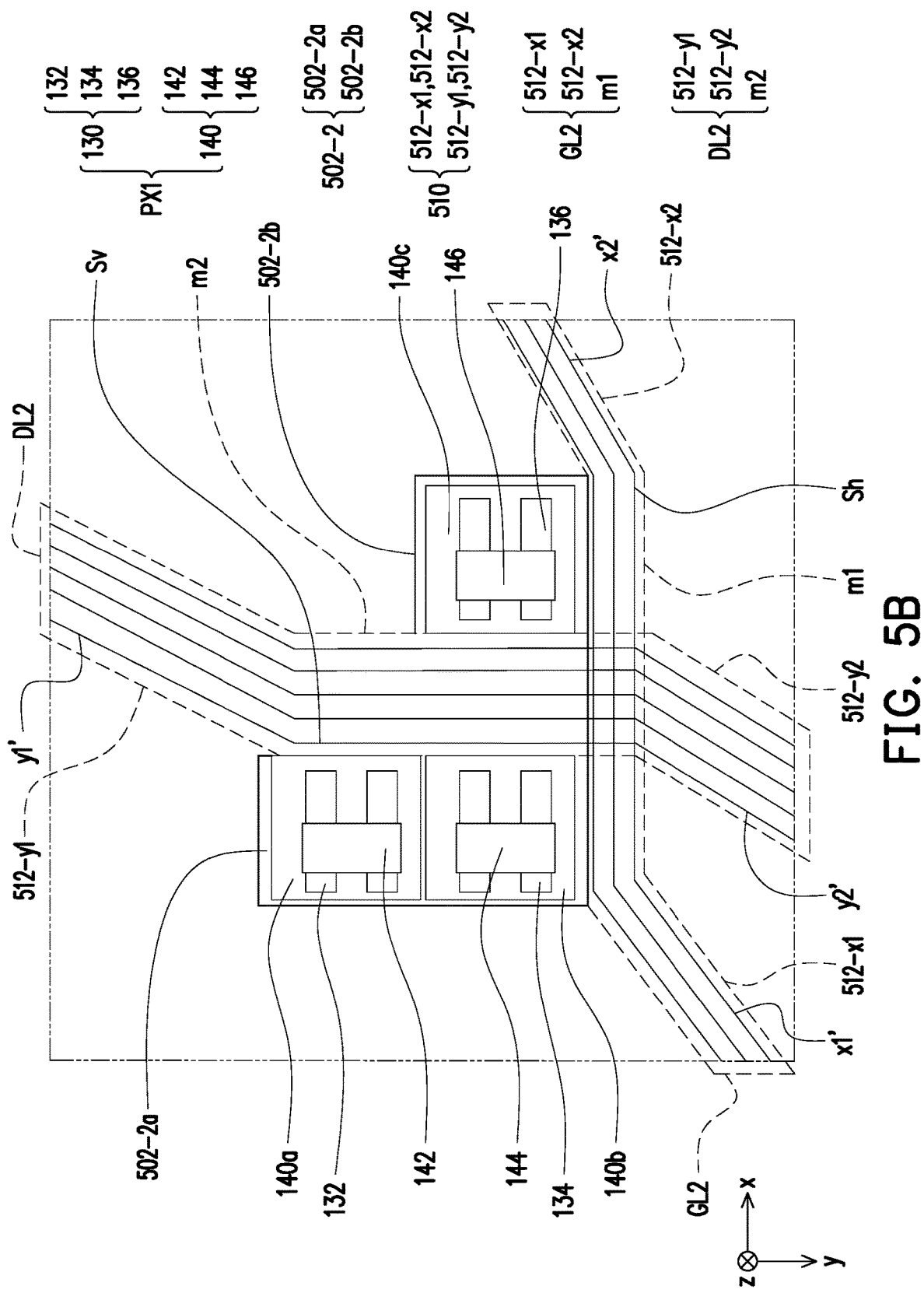
FIG. 5B is a partial enlarged schematic top view of the display panel of FIG. 5A.

FIG. 5A is a schematic top view of a display panel according to an embodiment of the invention. FIG. 5B is a partial enlarged schematic top plan view of a region R5 of the display panel of FIG. 5A. It should be noted here that the embodiment of FIG. 5A and FIG. 5B adopts the reference numerals and a portion of the content of the embodiment of FIG. 1A and FIG. 1C, wherein the same or similar elements are denoted by the same or similar reference numerals, and the description of the same technical content is omitted. For the description of the omitted portion, reference may be made to the above embodiments, which is not repeated herein.

Referring to FIG. 5, a display panel 50 includes a plurality of driving electrode regions 500 and a plurality of wiring regions 510, and the plurality of wiring regions 510 are connected between the driving electrode regions 500. The driving electrode regions 500 may be sequentially arranged along the arrangement direction to form a periodic array, and the arrangement direction may be, for example, the x-direction or the y-direction perpendicular to the x-direction. The (2n−1)th wiring region 510 extended from the (2n−1)th driving electrode region 500 toward the (2n)th driving electrode region 500 has a wiring extending direction forming a positive included angle with the arrangement direction, and the (2n)th wiring region 510 extended from the (2n)th driving electrode region 500 toward the (2n+1)th driving electrode region 500 has a wiring extending direction forming a negative included angle with the arrangement direction, wherein n is a positive integer. For example, included angles $\theta c_{x1-1}$, $\theta c_{x1-2}$, and $\theta c_{x1-3}$ of wiring regions 511-$x1$, 511-$x2$, and 511-$x3$ and the x-direction between adjacent driving electrode regions 501-1, 501-2, 501-3, and 501-4 are in an alternating positive and negative configuration. Included angles $\theta c_{y1-1}$, $\theta c_{y1-2}$, and $\theta c_{y1-3}$ of wiring regions 511-$y1$, 511-$y2$, and 511-$y3$ and the y-direction between adjacent driving electrode regions 501-1, 502-1, 503-1, and 504-1 are in an alternating positive and negative configuration.

Different from the display panel 10, in the present embodiment, each of the driving electrode regions 500 includes separate sub-driving electrode regions. For example, a driving electrode region 502-2 includes a sub-driving electrode region 502-2$a$ and a sub-driving electrode region 502-2$b$. The pixel units disposed in the driving electrode region 502-2 may include micro-LEDs 142, 144, and 146. For example, the micro-LEDs 142 and 144 may be disposed in the sub-driving electrode region 502-2$a$, and the micro-LED 146 may be disposed in the sub-driving electrode region 502-2$b$, but the invention is not limited thereto.

In the present embodiment, the display panel 50 further includes middle wiring regions m1 and m2 connected between adjacent wiring regions 510 and disposed side by side with the driving electrode regions 500. The middle wiring regions m1 and m2 may be extended along the x-direction or the y-direction, but the invention is not limited thereto. Specifically, a plurality of wirings may be disposed in the same gate circuit region GL, and the wirings in the corresponding segments of two wiring regions 510 adjacent to two sides of the same driving electrode region 500 may have the same extending direction but not on the same line. The middle wiring of the middle wiring region m1 may connect the wirings in the corresponding segments of the two wiring regions 510 adjacent to two sides of the same driving electrode region 500 and arrange them on one side of the driving electrode region 500 without overlapping with the driving electrode region 500.

For example, as shown in FIG. 5B, in the gate line region GL2, the second segment located in a wiring region 512-$x1$ and the first segment located in a wiring region 512-$x2$ are two segments adjacent to the driving electrode region 502-2. The extending direction of a wiring x1' located in the second segment of the wiring region 512-$x1$ and the extending direction of a wiring x2' located in the first segment of the wiring region 512-$x2$ are the same but not on the same line. A middle wiring Sh of the middle wiring region m1 is a wiring extended along the x-direction, connecting the wiring x1' and the wiring x2' to form a continuous signal line (such as a gate line). In other words, the gate line region GL2 may include the wiring regions 512-$x1$ and 512-$x2$ and the middle wiring region m1 connected between the wiring regions 512-$x1$ and 512-$x2$. The middle wiring Sh is arranged on the lower side of the sub-driving electrode region 502-2$a$ and the sub-driving electrode region 502-2$b$, and is not overlapped with the sub-driving electrode regions 502-2$a$ and 502-2$b$.

Similarly, a plurality of wirings may be disposed in the same data line region DL, corresponding segments of two wiring regions 510 adjacent to two sides of the same data line region DL have the same extending direction but are not on the same line, the middle wiring of the middle wiring region m2 may connect the wirings in the corresponding segments of the two wiring regions 510 adjacent to two sides of the same driving electrode region 500, and arrange them on one side of the driving electrode region 500 without overlapping with the driving electrode region 500.

For example, as shown in FIG. 5B, in the data line region DL2, the second segment located in a wiring region 512-$y1$ and the first segment located in a wiring region 512-$y2$ are two segments adjacent to the driving electrode region 502-2. The extending direction of a wiring y 1' located in the second segment of the wiring region 512-$y1$ and the extending direction of a wiring y2' located in the first segment of the wiring region 512-$y2$ are the same but not on the same line. A middle wiring Sv of the middle wiring region m2 is a wiring extended along the y-direction, connecting the wiring y 1' and the wiring y2' to form a continuous signal line (such as a data line). In other words, the data line regions DL2 may include the wiring regions 512-$y1$ and 512-$y2$ and the middle wiring region m2 connected between the wiring regions 512-$y1$ and 512-$y2$. The middle wiring Sv is arranged between the sub-driving electrode region 502-2$a$ and the sub-driving electrode region 502-2$b$, and is not overlapped with the sub-driving electrode regions 502-2$a$ and 502-2$b$. In the present embodiment, the projection of the driving electrode regions 500 in the z-direction is not overlapped with the projection of the wiring of the wiring regions 510 in the z-direction. For example, the sub-driving electrode region 502-2$a$ and the sub-driving electrode region 502-2$b$ are separated by the data line region DL2, the lower side edge of the sub-driving electrode region 502-2$a$ may be close to the upper side edge of the middle wiring region m1, the right side edge of the sub-driving electrode region 502-2a may be close to the left side edge of the middle wiring region m2, the lower side edge of the sub-driving electrode region 502-2b may be close to the upper side edge of the middle wiring region m1, and the left side edge of the sub-driving electrode region 502-2b may be close to the right side edge of the middle wiring region m2.

In the present embodiment, the driving electrode regions 500 and the wiring regions 510 may enclose a plurality of transmission regions 520, and two adjacent transmission regions 520 arranged along the arrangement direction of the driving electrode regions 500 have different geometric shapes and different areas. For example, as shown in FIG. 5A, the transmission regions 520 having the same shape as a transmission region 521-1 and the transmission regions 520 having the same shape as a transmission region 521-2 are staggered in the arrangement direction, and the area of the transmission region 521-1 is greater than the area of the transmission region 521-2.

Figure 6A:
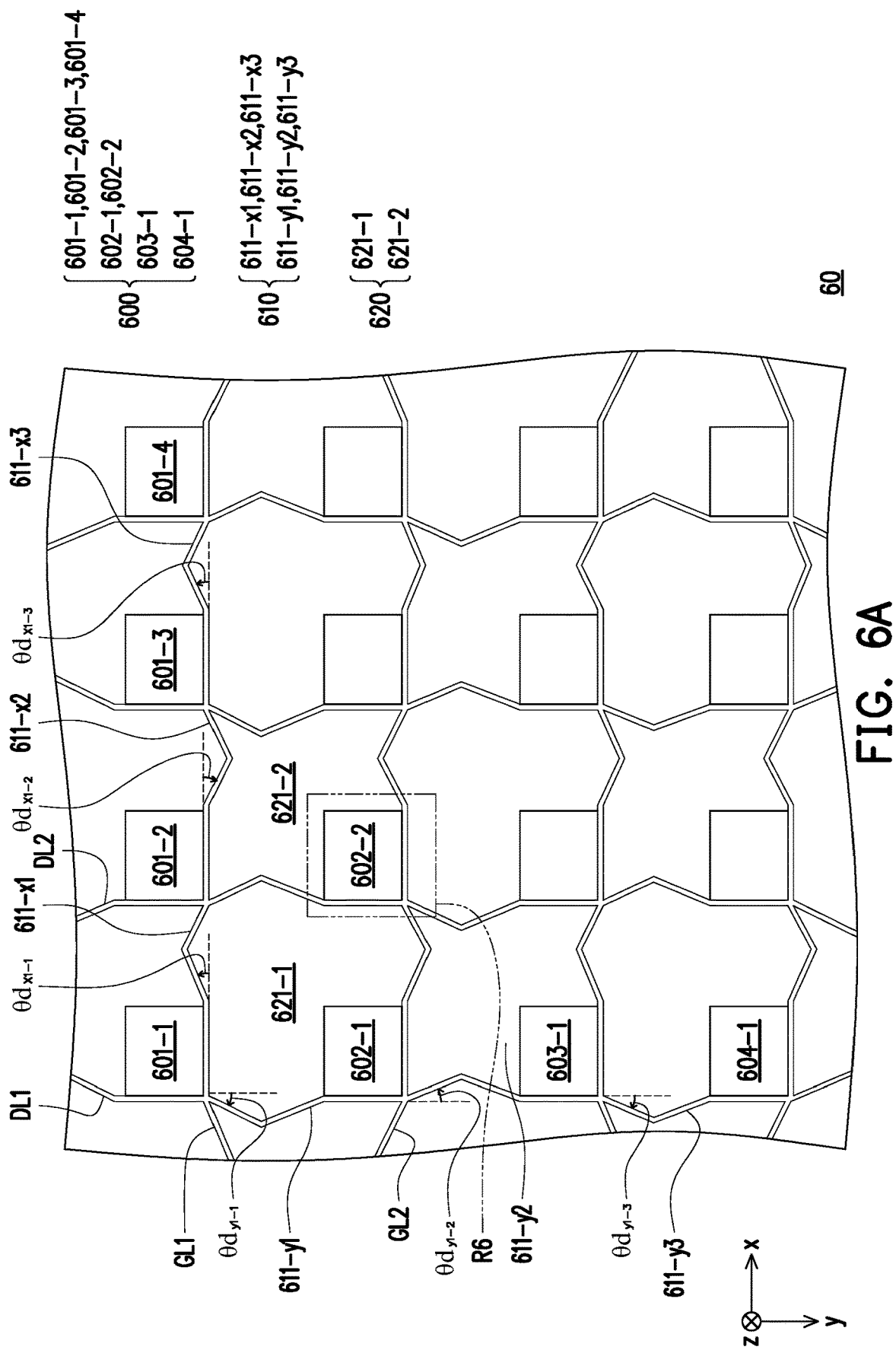
FIG. 6A is a schematic top view of a display panel according to an embodiment of the invention.
Figure 6B:
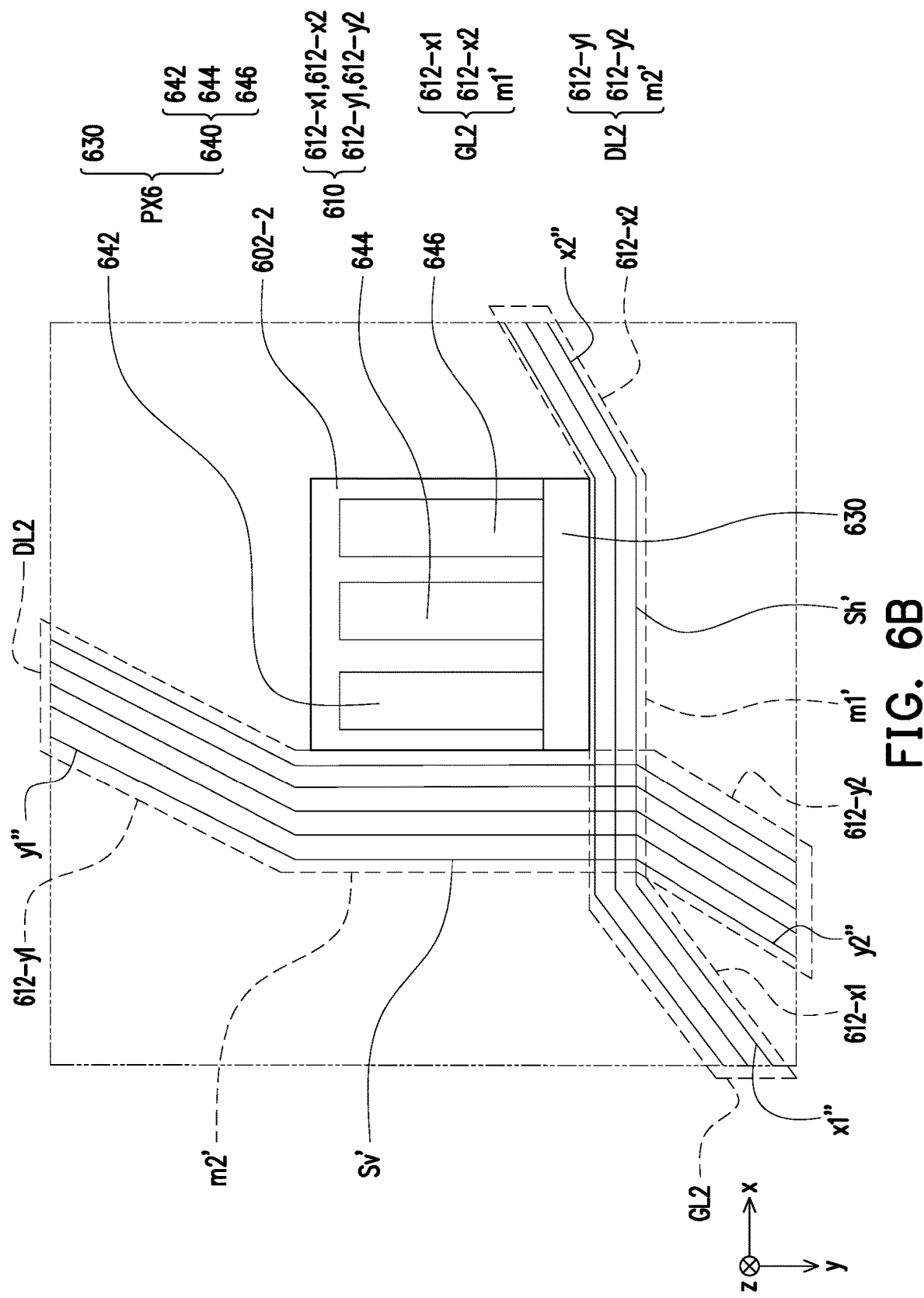
FIG. 6B is a partial enlarged schematic top view of the display panel of FIG. 6A.

FIG. 6A is a schematic top view of a display panel according to an embodiment of the invention. FIG. 6B is a partial enlarged top plan view of a region R6 of the display panel of FIG. 6A. It should be mentioned here that, the embodiment of FIG. 6A and FIG. 6B adopts the reference numerals and a portion of the content of the embodiment of FIG. 1A and FIG. 1C, wherein the same or similar elements are denoted by the same or similar reference numerals, and the description of the same technical content is omitted. For the description of the omitted portion, reference may be made to the above embodiments, which is not repeated herein.

Referring to FIG. 6A and FIG. 6B, a display panel 60 includes a plurality of driving electrode regions 600 and a plurality of wiring regions 610, and the plurality of wiring regions 610 are connected between the driving electrode regions 600. The driving electrode regions 600 may be sequentially arranged along the arrangement direction to form a periodic array, and the arrangement direction may be, for example, the x-direction or the y-direction perpendicular to the x-direction. The (2n−1)th wiring region 610 extended from the (2n−1)th driving electrode region 600 toward the (2n)th driving electrode region 600 has a wiring extending direction forming a positive included angle with the arrangement direction, and the (2n)th wiring region 610 extended from the (2n)th driving electrode region 600 toward the (2n+1)th driving electrode region 600 has a wiring extending direction forming a negative included angle with the arrangement direction, wherein n is a positive integer. For example, included angles $\theta d_{x1\text{-}1}$, $\theta d_{x1\text{-}2}$, and $\theta d_{x1\text{-}3}$ of wiring regions 611-x1, 611-x2, and 611-x3 and the x-direction between adjacent driving electrode regions 601-1, 601-2, 601-3, and 601-4 are in an alternating positive and negative configuration. Included angles $\theta d_{y1\text{-}1}$, and $\theta d_{y1\text{-}3}$ of wiring regions 611-y1, 611-y2, and 611-y3 and the y-direction between adjacent driving electrode regions 601-1, 602-1, 603-1, and 604-1 are in an alternating positive and negative configuration.

Different from the display panel 10, in the present embodiment, a plurality of wirings may be disposed in the same gate circuit region GL, and the wirings in the corresponding segments of two wiring regions 610 adjacent to two sides of the same driving electrode region 600 may have the same extending direction but not on the same line. The middle wiring in a middle wiring region m 1' may connect the wirings in the corresponding segments of the two wiring regions 610 adjacent to two sides of the same driving electrode region 600, and arrange them on one side of the driving electrode region 600 without overlapping with the driving electrode region 600.

For example, as shown in FIG. 6B, in the gate line region GL2, the second segment located in a wiring region 612-x1 and the first segment located in a wiring region 612-x2 are two segments adjacent to a driving electrode region 602-2. The extending direction of a wiring x1" located in the second segment of the wiring region 612-x1 and the extending direction of a wiring x2" located in the first segment of the wiring region 612-x2 may be substantially the same but not on the same line. A middle wiring Sh' of the middle wiring region m1' is a wiring extended along the x-direction, connecting the wiring x1" and the wiring x2" to form a continuous signal line (e.g., a gate line). In other words, the gate line region GL2 may include the wiring regions 612-x1 and 612-x2 and the middle wiring region m1' connected between the wiring regions 612-x1 and 612-x2. The middle wiring Sh' is arranged on the lower side of the driving electrode region 602-2 and not overlapped with the driving electrode region 602-2.

Similarly, a plurality of wirings may be disposed in the same data line region DL, corresponding segments of two wiring regions 610 adjacent to two sides of the same data line region DL have the same extending direction but are not on the same line, the middle wiring of a middle wiring region m2' may connect the wirings in the corresponding segments of the two wiring regions 610 adjacent to two sides of the same driving electrode region 600, and arrange them on one side of the driving electrode region 600 without overlapping with the driving electrode region 600.

For example, as shown in FIG. 6B, in the data line region DL2, the second segment located in a wiring region 612-y1 and the first segment located in a wiring region 612-y2 are two segments adjacent to the driving electrode region 602-2. The extending direction of a wiring y1" located in the second segment of the wiring region 612-y1 and the extending direction of a wiring y2" located in the first segment of the wiring region 612-y2 are the same but not on the same line. A middle wiring Sv' of the middle wiring region m2' is a wiring extended along the y-direction, connecting the wiring y1" and the wiring y2" to form a continuous signal line (such as a data line). In other words, the data line region DL2 may include the wiring regions 612-y1 and 612-y2 and a middle wiring region m2' connected between the wiring regions 612-y1 and 612-y2. The middle wiring Sv' is arranged on the left side of the driving electrode region 602-2 and is not overlapped with the driving electrode region 602-2.

In the present embodiment, the projection of the driving electrode regions 600 in the z-direction is not overlapped with the projection of the wiring of the wiring regions 610 in the z-direction. For example, the lower side edge of the driving electrode region 602-2 may be close to the upper side edge of the middle wiring region m1', and the left side edge of the driving electrode region 602-2 may be close to the right side edge of the middle wiring region m2'.

In the present embodiment, the display panel 60 may be implemented by sandwiching a display medium between two substrates, but the two substrates and the display medium are stacked in the z-direction. Therefore, the two substrates and the display medium are not shown in the figure. In some embodiments, the display panel 60 further includes a pixel unit PX6, and the pixel unit PX6 includes a pixel circuit element 630 and a plurality of corresponding pixel electrodes 640 (e.g., pixel electrodes 642, 644, and 646). In some embodiments, the display medium of the display panel 60 is, for example, a liquid-crystal material driven via the pixel unit PX6 to achieve display function. The pixel unit PX6 may be disposed in the driving electrode regions 600, and the shape of the driving electrode regions 600 is, for example, a rectangle, but not limited thereto. The pixel circuit element 630 is, for example, a TFT and is electrically connected to the corresponding plurality of pixel electrodes 640.

In the present embodiment, the driving electrode regions 600 and the wiring regions 610 may enclose a plurality of transmission regions 620, and two adjacent transmission regions 620 arranged along the arrangement direction of the driving electrode regions 600 have different geometric shapes and different areas. For example, as shown in FIG. 6A, the transmission regions 620 having the same shape as a transmission region 621-1 and the transmission regions 620 having the same shape as a transmission region 621-2 are staggered in the arrangement direction, and the area of the transmission region 621-1 is greater than the area of the transmission region 621-2.

Based on the above, in the display panel of the invention, the included angles of the wiring extending directions of the wiring regions between adjacent driving electrode regions and the arrangement directions thereof are arranged in a positive and negative alternate configuration in the arrangement directions to effectively reduce the diffraction intensity of first-order diffraction and high-frequency terms, thereby improving the image quality of the display panel.

What is claimed is:

1. A display panel, comprising:
a plurality of driving electrode regions; and
a plurality of wiring regions connected between the driving electrode regions,
wherein the driving electrode regions are arranged in sequence along an arrangement direction, a (2n−1)th wiring region extended from a (2n−1)th driving electrode region toward a (2n)th driving electrode region has a wiring extending direction forming a positive included angle with the arrangement direction, and a (2n)th wiring region extended from the (2n)th driving electrode region toward a (2n+1)th driving electrode region has a wiring extending direction forming a negative included angle with the arrangement direction, wherein n is a positive integer,
wherein angles of the positive included angle and the negative included angle are respectively 5 degrees to 44 degrees.

2. The display panel of claim 1, wherein the (2n−1)th wiring region and the (2n)th wiring region are respectively located on two opposite sides of straight connecting lines of the (2n−1)th driving electrode region, the (2n)th driving electrode region, and the (2n+1)th driving electrode region.

3. The display panel of claim 1, wherein each of the wiring regions comprises a plurality of segments, and two adjacent segments have different extending directions.

4. The display panel of claim 1, wherein each of the wiring regions is first extended from one of the driving electrode regions along a first direction and then extended along a second direction toward the next driving electrode region, and the first direction is intersected with the second direction.

5. The display panel of claim 1, wherein the driving electrode regions and the wiring regions have an average optical transmittance of less than 10%.

6. The display panel of claim 1, wherein the driving electrode regions and the wiring regions enclose a plurality of transmission regions, and two adjacent transmission regions arranged along the arrangement direction have different geometric shapes.

7. The display panel of claim 6, wherein an average optical transmittance of the transmission regions is 10% to 99%.

8. The display panel of claim 1, further comprising a plurality of pixel units, wherein the pixel units are respectively disposed in the driving electrode regions.

9. The display panel of claim 8, wherein each of the pixel units comprises a plurality of light-emitting units.

10. The display panel of claim 8, wherein each of the pixel units comprises a pixel circuit element.

11. The display panel of claim 10, further comprising:
a display medium, wherein each of the pixel units further comprises a plurality of pixel electrodes, wherein the pixel electrodes are electrically connected to the pixel circuit elements, and the display medium is adapted to be driven by the pixel units.

12. A display panel, comprising:
a plurality of driving electrode regions; and
a plurality of wiring regions connected between the driving electrode regions,
wherein the driving electrode regions are arranged in sequence along an arrangement direction, a (2n−1)th wiring region extended from a (2n−1)th driving electrode region toward a (2n)th driving electrode region has a wiring extending direction forming a positive included angle with the arrangement direction, and a (2n)th wiring region extended from the (2n)th driving electrode region toward a (2n+1)th driving electrode region has a wiring extending direction forming a negative included angle with the arrangement direction, wherein n is a positive integer,
wherein the driving electrode regions and the wiring regions enclose a plurality of transmission regions, and two adjacent transmission regions arranged along the arrangement direction have different geometric shapes.

13. The display panel of claim 12, wherein an average optical transmittance of the transmission regions is 10% to 99%.

14. The display panel of claim 12, wherein the driving electrode regions and the wiring regions have an average optical transmittance of less than 10%.

15. The display panel of claim 12, wherein the (2n−1)th wiring region and the (2n)th wiring region are respectively located on two opposite sides of straight connecting lines of the (2n−1)th driving electrode region, the (2n)th driving electrode region, and the (2n+1)th driving electrode region.

16. A display panel, comprising:
a plurality of driving electrode regions; and
a plurality of wiring regions connected between the driving electrode regions,
wherein the driving electrode regions are arranged in sequence along an arrangement direction, a (2n−1)th wiring region extended from a (2n−1)th driving electrode region toward a (2n)th driving electrode region has a wiring extending direction forming a positive included angle with the arrangement direction, and a (2n)th wiring region extended from the (2n)th driving electrode region toward a (2n+1)th driving electrode region has a wiring extending direction forming a negative included angle with the arrangement direction, wherein n is a positive integer,
wherein the driving electrode regions and the wiring regions have an average optical transmittance of less than 10%.

17. The display panel of claim 16, wherein the (2n−1)th wiring region and the (2n)th wiring region are respectively located on two opposite sides of straight connecting lines of the (2n−1)th driving electrode region, the (2n)th driving electrode region, and the (2n+1)th driving electrode region.

\* \* \* \* \*